US011422886B2

United States Patent
Zhang et al.

(10) Patent No.: US 11,422,886 B2
(45) Date of Patent: Aug. 23, 2022

(54) DIE LEVEL DATA REDUNDANCY IN SOLID STATE STORAGE DEVICES

(71) Applicant: Microsoft Technology Licensing, LLC, Redmond, WA (US)

(72) Inventors: Chenfeng Zhang, San Diego, CA (US); Vamsi Sata, San Diego, CA (US); Monish Shah, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/738,098

(22) Filed: Jan. 9, 2020

(65) Prior Publication Data

US 2021/0216399 A1  Jul. 15, 2021

(51) Int. Cl.
  *G06F 11/10* (2006.01)
  *G11C 16/10* (2006.01)
  *G11C 16/04* (2006.01)

(52) U.S. Cl.
  CPC ...... *G06F 11/1068* (2013.01); *G11C 16/0483* (2013.01); *G11C 16/10* (2013.01)

(58) Field of Classification Search
  CPC .. G06F 11/1068; G11C 16/0483; G11C 16/10
  See application file for complete search history.

(56) References Cited

U.S. PATENT DOCUMENTS

| | | | |
|---|---|---|---|
| 9,015,561 B1 * | 4/2015 | Hu ..................... | G11C 16/0483 714/773 |
| 9,136,022 B2 * | 9/2015 | Raghu ................. | G11C 29/822 |
| 10,318,378 B2 | 6/2019 | Hoei et al. | |
| 10,943,662 B1 * | 3/2021 | Linnen ............... | G11C 11/5628 |
| 2010/0162065 A1 | 6/2010 | Norman | |
| 2011/0072189 A1 | 3/2011 | Post et al. | |
| 2011/0302477 A1 | 12/2011 | Goss et al. | |
| 2014/0068142 A1 | 3/2014 | Meir et al. | |
| 2014/0359400 A1 * | 12/2014 | Avila ................. | G06F 12/0246 714/773 |
| 2015/0109861 A1 | 4/2015 | Tailliet | |
| 2015/0121157 A1 * | 4/2015 | Raghu ................. | G11C 29/838 714/723 |
| 2015/0339187 A1 | 11/2015 | Sharon et al. | |
| 2018/0336139 A1 | 11/2018 | Rao et al. | |
| 2019/0354478 A1 * | 11/2019 | Kashyap ............. | G06F 3/064 |
| 2020/0218605 A1 * | 7/2020 | Subramanian ..... | G06F 11/1068 |

(Continued)

OTHER PUBLICATIONS

"International Search Report and Written Opinion Issued in PCT Application No. PCT/US20/062451", dated Feb. 26, 2021, 21 Pages.

(Continued)

*Primary Examiner* — Kyle Vallecillo

(57) ABSTRACT

Data redundancy arrangements for memory and storage devices are discussed herein. In one example, a method of operating a data storage system includes identifying a data page for storage in a non-volatile memory die, and generating one or more data redundancy bits for the data page. The method also includes writing the data page to the non-volatile memory die by at least spanning bits of the data page and the one or more data redundancy bits across a quantity of data storage cells that share a structural property in the non-volatile memory die.

12 Claims, 6 Drawing Sheets

(56) References Cited

U.S. PATENT DOCUMENTS

2020/0272540 A1* 8/2020 Sun .................. H01L 27/11582

OTHER PUBLICATIONS

Kim, et al., "Chip-Level RAID with Flexible Stripe Size and Parity Placement for Enhanced SSD Reliability", In Journal of IEEE Transactions on Computers, vol. 65, Issue 4, Apr. 1, 2016, pp. 1116-1130.
Shadley, Scott, "Nand Flash Media Management Through RAIN", Retrieved From: https://web.archive.org/web/20210812183125/https://www.micron.com/-/media/client/global/documents/products/technical-marketing-brief/brief_ssd_rain.pdf. Aug. 12, 2021, 7 Pages.

* cited by examiner

DIE LEVEL DATA REDUNDANCY IN SOLID STATE STORAGE DEVICES

BACKGROUND

Integrated circuit devices, such as central processing units (CPUs), graphics processing units (GPUs), or system-on-a-chip (SoC) devices can be employed in computing systems. These various integrated circuit devices might interface with memory or storage devices to store and retrieve data for short term and long term storage. Although magnetic hard disk drives (HDDs) have been employed in the past, many newer computing systems employ solid state storage devices which comprises non-volatile memory elements. These non-volatile memory elements can include various forms of semiconductor-based flash memory, such as NAND or NOR flash, as well as other types of data storage elements including magnetic, magnetoresistive, memristor, phase change, and optical technologies. When flash memory is employed, the non-volatile memory elements will typically be fabricated into a semiconductor die which includes an array of memory cells arranged into various physical structures. On-die interfacing and control circuitry might also be included.

In many computer designs, such as laptops, tablets, smartphones, servers, desktop computers, and the like, an array of many physically separate storage dies are employed to obtain a desired amount of storage space for data. Although this can vary based on application, user data is often spread over several separate flash memory dies that form a memory or storage subsystem. However, when one or more of the dies experiences a failure, user data can be lost. This threat of data loss can be further exasperated when fewer semiconductor dies are employed due in part to increasing flash memory densities driven by reductions in memory cell features sizes and more efficient three-dimensional packing of memory cells.

OVERVIEW

Data redundancy arrangements for memory and storage devices are discussed herein. In one example, a method of operating a data storage system includes identifying a data page for storage in a non-volatile memory die, and generating one or more data redundancy bits for the data page. The method also includes writing the data page to the non-volatile memory die by at least spanning bits of the data page and the one or more data redundancy bits across a quantity of data storage cells that share a structural property in the non-volatile memory die.

In another example, a storage control system includes a data interface configured to receive data for storage in a non-volatile memory die, and a control circuit configured to generate one or more data redundancy bits for the data. The storage control system also includes a memory interface configured to write the data to the non-volatile memory die by at least spanning one or more data pages comprising bits of the data and the one or more data redundancy bits across a quantity of data storage cells that share a structural property in the non-volatile memory die.

In another example, an apparatus includes one or more computer readable storage media, and a processing system operatively coupled with the one or more computer readable storage media. Program instructions are stored on the one or more computer readable storage media that, based on being read and executed by the processing system, direct the processing system to at least identify data for storage in a non-volatile memory die, generate one or more data redundancy bits for the data, and write one or more data pages to the non-volatile memory die by at least spanning bits of the data and the one or more data redundancy bits across a quantity of data storage cells that share a structural property in the non-volatile memory die.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
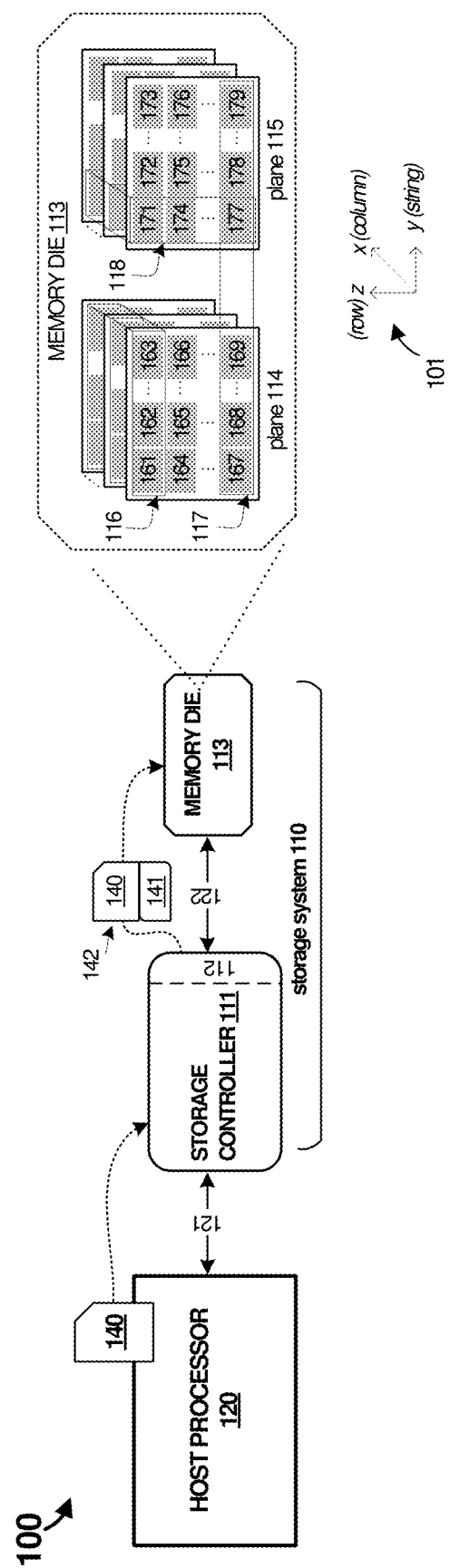
FIG. 1 illustrates a computing system in an implementation.

Various computing devices, such as laptops, tablets, smartphones, servers, and desktop computers employ storage systems for storing and retrieving user data and system data. Example storage systems can include solid state storage systems having non-volatile memory (NVM) devices formed using one or more NVM storage chips. These NVM storage chips comprise semiconductor dies which can store data bits within memory cells. Various storage technologies might be employed to form the memory cells, such as flash memory comprising NAND or NOR cells formed using transistor-based memory cells. Other suitable storage technologies include 3D XPoint storage, magnetic random-access memory (MRAM), phase-change memory (PCM), resistive random-access memory (ReRAM), and memristor memory. The various enhanced techniques and methods discussed herein relate primarily to storage technologies comprised of non-volatile memory cells which are formed into large arrayed structures.

Individual non-volatile memory dies can be arrayed to obtain a target size of storage space for data. Each individual memory die can contain only a limited amount of storage space, and thus user data is often spread over several separate memory dies that form a memory or storage subsystem. Data redundancy techniques can be employed across several memory dies so that when one or more of the dies experiences a failure, user data is less likely to be lost or corrupted. Example data redundancy techniques can include redundant array of individual/independent disks/drives (RAID) techniques. However, an increased threat of data loss or corruption is encountered when fewer semiconductor dies are employed to achieve a target storage size, due in part to increasing memory densities driven by reductions in memory cell features sizes and more efficient three-dimensional packing of memory cells. At the terabit (Tb) per-die density, a computing system might only employ a single memory die for 128 gigabytes (GB) or more of data storage. In such systems with a reduced quantity of dies, the overhead penalty of doing drive RAID across multiple dies increases to undesirable levels, particularly when two or fewer memory dies are employed.

The examples herein employ techniques of die-level data redundancy, such as die-level RAID, having data redundancy contained to within an individual memory die. Advantageously, data redundancy for reduced data loss and corruption can be achieved even in computing systems which use few memory dies, such as one single die, without the undesirable overhead found in multi-die (e.g. drive-level) RAID. In one example, die-level RAID is performed across multiple memory holes or vertical NAND chains of physical wordline (WL) layers of a 3D memory array, along with using multiple planes per die, such as 2, 4, or 8 planes, among other configurations. A vertical NAND chain, referred to herein as a memory hole, comprises a set of series-connected memory cells which share a bitline (BL) connection within a memory array. A bitline can comprise connections within a 'column' of a memory array, while a wordline can comprise connections within a 'row' of a memory array. For example, when NAND flash cells are employed, each cell might comprise a transistor, and many transistors are coupled in series (e.g. a NAND configuration) by source-drain terminals. Each cell in a memory hole can be controlled with a different wordline coupled to a control gate terminal of the transistor of the cell. Other memory technologies might be coupled using different techniques, but typically still include row-by-column addressing techniques which have analogues to the wordline/bitline structure. Since wordline failures comprise one of the more frequent failure modes of memory dies, data redundancy employed at the wordline level can significantly reduce the failure frequency of an associated memory die. Similar data redundancy techniques can be applied to memory hole data redundancy as well, as will be discussed below.

Turning now to a first example of an enhanced die-level data redundancy system, FIG. 1 is presented. FIG. 1 includes computing system 100 comprising storage system 110 coupled to host processor 120 over link 121. Storage system 110 includes storage controller 111 and memory die 113 coupled over link 122. Memory die 113 comprises one or more planes, notably planes 114-115 in FIG. 1. A different quantity of planes might instead be employed in memory die 113, such as four or more. Directional axes 101 are shown in FIG. 1 to aid in illustration of one example physical configuration of memory die 113.

In operation, host system 120 transfers data 140 for storage by storage system 110. Data 140 might comprise write data which accompanies one or more write commands or write operations issued by host system 120. This write data can include user data, system data, cache data, or other various data employed by user applications, operating systems, virtualized systems, and other various software and hardware elements. Data 140 is received by storage controller 111 over link 121 and redundancy data 141 is calculated for data 140. A format of one or more combined data pages 142 comprising data 140 and redundancy data 141 can be specific to a data redundancy scheme as well as structural configuration of memory die 113, which will be discussed below. Once data pages 142 are determined, then media interface 112 can be employed to write data pages 142 to memory cells of memory die 113.

One example arrangement of memory cells is shown for memory die 113 in FIG. 1. Memory die 113 might comprise an array of memory cells, with 'vertical' sets of bitline-coupled memory cells controlled by 'horizontal' wordlines. This example arrangement includes two die planes 114-115 that each comprise a subset of the total quantity of memory cells for the die. Each plane can typically operate independently with regard to data read/write/erase operations, and typically each plane will have a separate underlying source line connection. Within each plane, memory blocks are formed which include a predetermined quantity of pages, such as hundreds of pages. A page comprises a collection of memory cells, such as hundreds to thousands of memory cells. Blocks are typically the smallest granularity for erase operations, while pages are typically the smallest granularity accessible for write operations.

In three-dimensional (3D) NAND dies, an example axis arrangement 101 shown in FIG. 1 includes vertical rows (z-axis), horizontal strings (y-axis), horizontal columns (x-axis), and separate planes 114-115 of memory die 113. This 3D arrangement is shown in FIG. 1 as having multiple wordline (WL) layers within each plane in the 'z' axis, with each layer comprising another set of columns and memory holes of memory cells. Example 3D arrangements can include dozens of layers, such as 64 layers, among others. The wordlines in each layer might be coupled to each other, forming wordline-coupled 'planes' of memory cells stacked in the z-axis. In this manner, a high density of memory cells can be achieved in a single semiconductor die.

Figure 2:
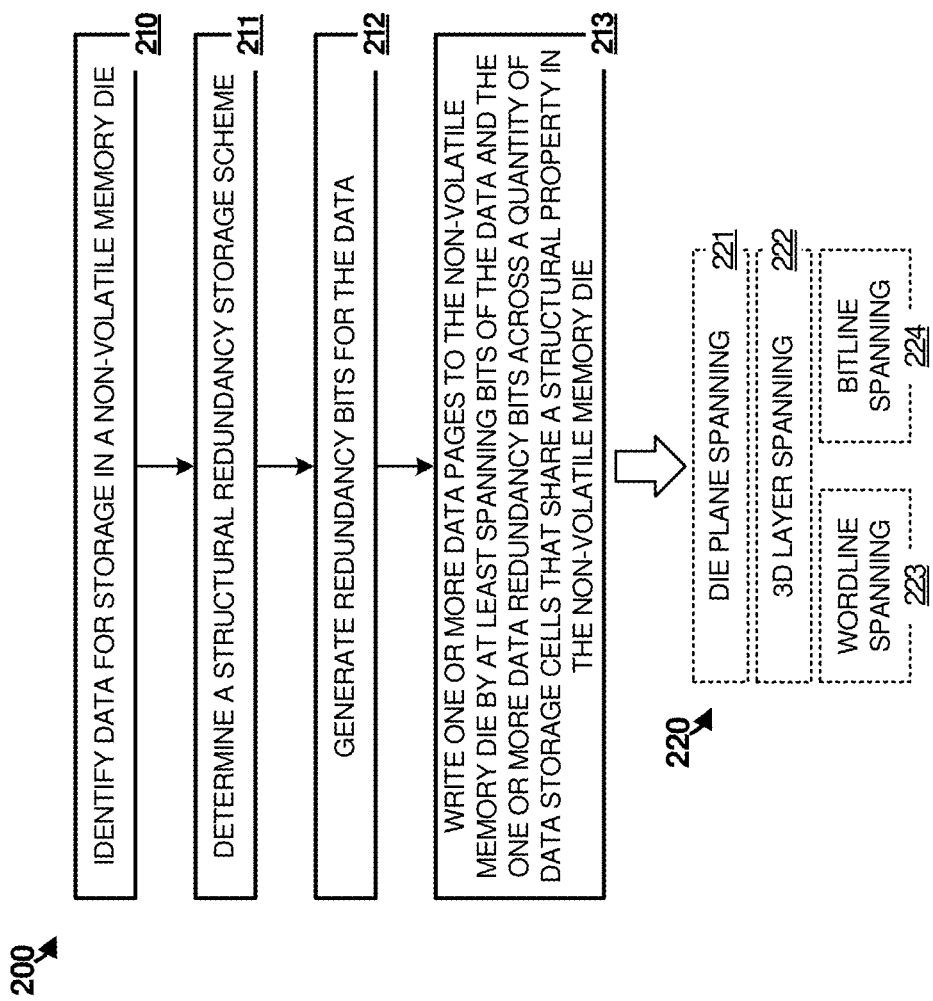
FIG. 2 illustrates operations of a storage system in an implementation.

Turning now to an example operation of the elements of computing system 100, FIG. 2 is presented. FIG. 2 illustrates various enhanced techniques for writing data using die-level redundancy, in the context of the elements of FIG. 1. In FIG. 2, storage controller 111 identifies (210) data 140 for storage by storage system 110. Data 140 might be transferred over link 121 by host processor 120 or various software elements executed by host processor 120. Storage controller 111 can store data 140 in at least one non-volatile memory die, illustrated by memory die 113 in FIG. 1. This storage process occurs via media interface 112 and one or more links 122.

To store this data 140, storage controller 111 first determines (211) a structural redundancy storage scheme appropriate for the storage media. In this example, a single memory die 113 is employed, and thus striping of data over more than one die might not be appropriate or feasible. Even if more than one die is employed, similar redundancy storage schemes as discussed herein can be employed within individual dies. The structural die-level redundancy types 220 include die plane spanning 221, 3D layer spanning 222, wordline spanning 223, and bitline spanning 224, as indicated in FIG. 2. Based on the selected structural redundancy type, storage controller 111 generates (212) redundancy bits 141 for data 140. Storage controller 111 writes (213) one or more data pages 142 comprising data 140 and redundancy bits 141 to memory die 113 by at least spanning bits of data 140 and the one or more data redundancy bits 141 across a quantity of data storage cells that share a structural property in non-volatile memory die 113.

As mentioned above, the structural die-level redundancy types 220 might include die plane spanning 221, 3D layer spanning 222, wordline spanning 223, and bitline spanning 224. Die plane spanning 221 refers to spanning data across more than one plane of memory cells in memory die 113. Each plane of memory cells corresponds to planes 114-115 in die 113, which comprise separately addressable collections of memory cells. Each plane can execute storage commands in parallel with each other, and may comprise separate physical semiconductor wells, substrate portions, or separate source plates/planes within die 113. Three-dimensional (3D) layer spanning 222 refers to spanning data and associated redundancy bits within one or more memory holes across more than one 3D layer of memory cells in memory die 113. Each 3D layer of memory cells span into die 113 along the 'z' axis of FIG. 1, and each plane 114-115 can have a separate set of 3D layers. Each 3D layer typically will have an associated wordline/wordplane, and thus each memory hole spans across many wordlines, with a redundancy bit included in each memory hole. Wordline spanning 223 refers to spanning data and associated redundancy bits across a wordline/wordplane of memory cells. Bitline spanning 224 refers to spanning data across cells that share a common wordline but have different bitlines. In the examples herein, typical spanning will comprise die plane, wordline, and bitline spanning done in combination, or 3D layer spanning and bitline spanning done in combination.

FIG. 1 shows example spanning types 116-118 for die 113. In spanning type 116, a wordline spanning is employed. Data bits comprising one or more data pages 142 are spread over memory cells 161-163 in the 'y' axis that are within a common wordline. This wordline spanning can also be extended across planes 114-115, in which case memory cells 171-173 would also be spanned by data pages 142. The plane spanning and wordline spanning is shown as spanning type 117 in FIG. 1 that includes memory cells 167-169 and 177-179. Redundancy bits can be stored in one or more of the memory cells, such as a single memory cell of the wordline spanning arrangement, so that data 140 is written first and redundancy data 141 is subsequently written. Wordline spanning can also span over more than one string of memory cells, which are oriented in the 'y' axis in FIG. 1. Thus, slices of memory cells in the 'z' axis might have data spanned over a common 'wordplane' that encompasses several columns in the 'x' axis and several strings in the 'y' axis to form a 2D horizontal 'plane' of memory cells oriented in the 'x' and 'y' axes in FIG. 1. In spanning type 118, a collection of memory holes and columns of memory cells have one or more data pages 142 spread therein. Each memory hole shares a bitline connection, and is oriented in the 'z' direction in FIG. 1, while each column has a different bitline connection in the 'x' direction. Redundancy bits can be stored in one or more of the memory cells of each memory hole, such as a single memory cell of each memory hole, so that data 140 is written first and redundancy data 141 is subsequently written to each memory hole.

Returning to the elements of FIG. 1, host processor 120 can comprise one or more microprocessors and other processing circuitry that retrieves and executes software, such as user interfaces, operating systems, and user applications from an associated storage system. Host processor 120 can be implemented within a single processing device but can also be distributed across multiple processing devices or sub-systems that cooperate in executing program instructions. Examples of host processor 120 include general purpose central processing units, application specific processors, and logic devices, as well as any other type of processing device, combinations, or variations thereof. In some examples, host processor 120 comprises an Intel® or AMD® microprocessor, ARM® microprocessor, field-programmable gate array (FPGA), application specific integrated circuit (ASIC), application specific processor, or other microprocessor or processing elements.

Link 121 can comprise various wired or wireless storage links or network links, such as Peripheral Component Interconnect Express (PCIe), NVM Express (NVMe), Non-Volatile Memory Host Controller Interface Specification (NVMHCIS), Gen-Z, Ethernet, InfiniBand, Ethernet, Serial Attached SCSI (SAS), FibreChannel, Thunderbolt, serial AT attachment (SATA), SATA Express, universal serial bus (USB), HyperTransport (HT), Cache Coherent Interconnect for Accelerators (CCIX), or Open Coherent Accelerator Processor Interface (OpenCAPI), among others, including combinations thereof.

Storage system 110 includes storage controller 111, media interface 112, memory die 113, and link 122. Storage controller 111 can include various circuitry and interface logic to handle reading, writing, and erasing with memory die 113. Storage controller 111 might include various queues or buffers for instructions and data. Storage controller 111 can comprise a field-programmable gate array (FPGA), application specific integrated circuit (ASIC), application specific processor, or other circuit and logic elements. Media interface 112 can comprise a Common Flash Memory Interface (CFI), Open NAND Flash Interface (ONFI), synchronous or asynchronous storage interface, toggle command protocol interface. Links 122 can comprise various circuit traces, physical layer link elements, passive circuit elements, impedance matching elements, and the like.

Memory die 113 comprises a discrete set of memory cells that form a storage media included onto a substrate and having a physical package to house the storage media and couple electrical connections of the storage media to external circuit elements. As mentioned herein, memory die 113 can include one or more planes and one or more 3D layers, among other arrangements. Examples of storage media employed by memory die 113 include NAND flash, NOR flash, 3D XPoint storage, magnetic random-access memory (MRAM), phase-change memory (PCM), resistive random-access memory (ReRAM), memristor memory, or any other non-volatile storage media. Although the examples herein typically comprise non-volatile memory technologies, similar techniques might also be applied to volatile memory technologies, such as static random-access memory (SRAM) or dynamic random access memory (DRAM).

Figure 3A:
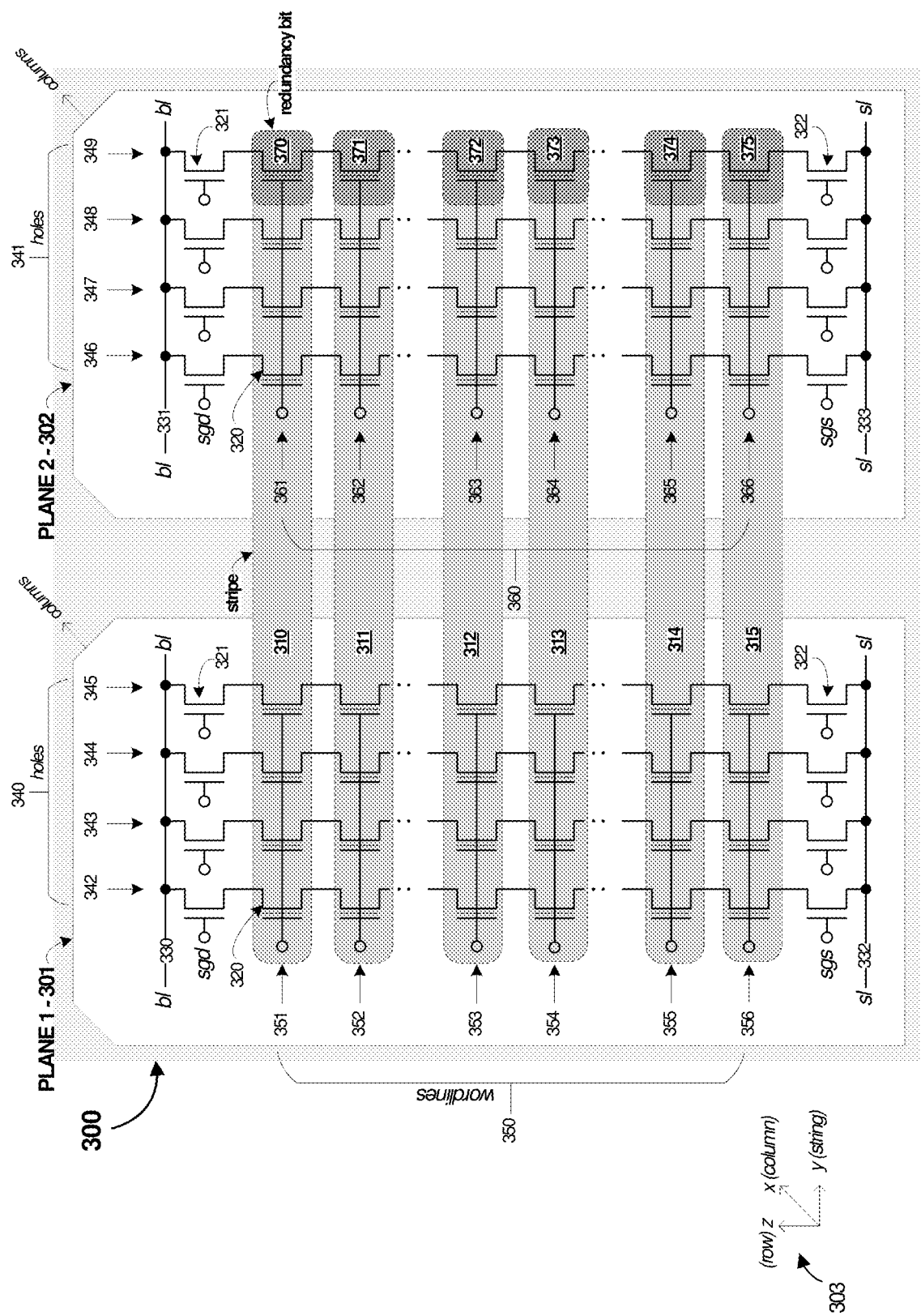
FIG. 3A illustrates an example data redundancy scheme on a data storage die in an implementation.
Figure 3B:
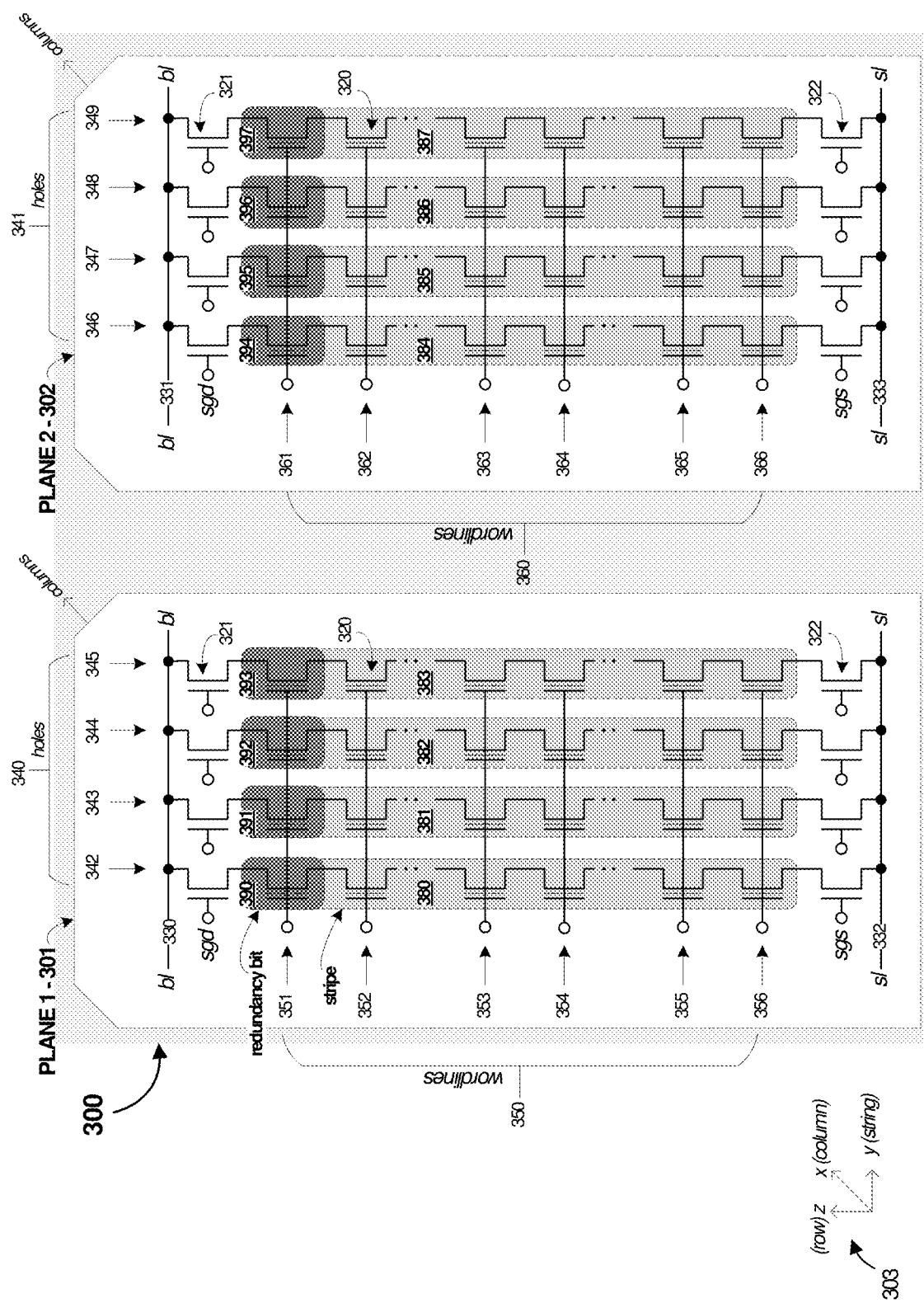
FIG. 3B illustrates an example data redundancy scheme on a data storage die in an implementation.

FIGS. 3A and 3B illustrate elements of an example data storage die 300 in an implementation. Coordinate system 303 is shown for referencing various directional axes in FIGS. 3A and 3B. FIG. 3A illustrates a wordline and plane spanning configuration, while FIG. 3B illustrates a memory hole and plane spanning configuration. Die 300 can be an example of die 113 of FIG. 1, although other configurations are possible. Die 300 includes two planes 301-302 of memory cells, each plane comprising a separately addressable set of rows ('z' axis) and columns ('y' axis). Rows in the z-axis correspond to memory holes and columns in the y-axis correspond to wordlines, although other configurations are possible. Each plane 301-302 can also have a three-dimensional structure in the 'x' axis which comprises columns that replicate a physical arrangement shown for each plane 301-302. Wordlines of similar columns of each 3D layer formed in the x-y axes can be coupled together forming wordplanes.

In plane 301, a plurality of memory holes 340 of memory cells are included. Each memory cell 320 comprises an individual NAND flash cell, which might comprise a single-level cell (SLC) or multi-level cell that might include MLC, triple-level cells (TLC), or quad-level cells (QLC), among others. Each memory hole 342-345 extends in the 'z' axis and is formed from a row set of memory cells 320 coupled drain-to-source. At the top of each memory hole is a corresponding select element 321 which has a gate terminal coupled to a select line (sgd), a drain terminal coupled to bitline (bl) 330, and a source terminal coupled to a first cell in a corresponding set of memory cells. At the bottom of each memory hole is a corresponding ground select element 322 which has a gate terminal coupled to a select line (sgs), a drain terminal coupled to a last cell in a corresponding row set of memory cells, and a source terminal coupled to select line 332. Plane 301 also has a corresponding set of wordlines (wl) 350 that couple gate terminals of a column set of memory cells arranged in the 'y' axis.

In plane 302, a plurality of memory holes 341 of memory cells are included. Each memory cell 320 comprises an individual NAND flash cell. Each memory hole 346-349 extends in the 'z' axis and is formed from a row set of memory cells 320 coupled drain-to-source. At the top of each memory hole is a corresponding select element 321 which has a gate terminal coupled to a select line (sgd), a drain terminal coupled to bitline (bl) 331, and a source terminal coupled to a corresponding first cell in a set of memory cells. At the bottom of each memory hole is a corresponding ground select element 322 which has a gate terminal coupled to a ground select line (sgs), a drain terminal coupled to a last cell in a corresponding row set of memory cells, and a source terminal coupled to select line 333. Plane 302 also has a corresponding set of wordlines (wl) 360 that couple gate terminals of a column set of memory cells arranged in the 'y' axis.

In one example operation shown in FIG. 3A, individual memory cells can be programmed by control of the selection lines (sgd/sgs) and wordlines and data presented on the associated bitline. In one example a set of memory cells that span planes 301-302 is programmed to hold a set of data, and a redundancy bit is stored in the final memory cell of the set. For example, a wordline stripe 310 might be employed where wordlines 351 and 361 are programmed as a set (spanning planes 301-302), and redundancy bit 370 is programmed into a final memory cell of stripe 310. When a 3D arrangement is employed, then the data set could span not only the memory cells of wordlines 351-361, but also a plurality of columns within an x-y plane slice of the 3D arrangement, forming a stripe across an x-y plane of memory cells. More than one redundancy bit can be employed when the data page is striped across the x-y axes, with a final cell of each associated wordline/column holding the redundancy bit. Further similar redundancy arrangements are shown in FIG. 3A for wordline and plane spanning stripes 311-315 having associated redundancy bits 371-375

In another example operation shown in FIG. 3B, sets of memory cells that span in the 'z' axis in memory holes 340-341 of planes 301-302 are programmed to hold a set of data, and a redundancy bit is stored in a memory cell of each memory hole. In this example, stripe 380 might be employed where memory cells of memory hole 342 are programmed as a set, and redundancy bit 390 is programmed into a designated memory cell of stripe 380. Plane spanning might also be employed, where the data set is spanned over not only memory hole 342, but also memory hole 346. A redundancy bit might be employed at the end of the plane-spanning stripe. Separate stripes for each memory hole might instead be employed, such as a separate stripes 380-387 with associated redundancy bits 390-397. When a 3D arrangement is employed, then the data set could span not only the memory cells of a single memory hole, but also a plurality of columns within a z-x axis slice of the 3D arrangement, forming a stripe across a z-x plane of memory cells. More than one redundancy bit can be employed when the data set is striped across the z-x axes, with a designated cell of each associated memory hole holding a redundancy bit.

The previous examples discuss SLC memory cells, but similar techniques can apply to memory cells with more than one bit per cell capacity, such as MLC, TLC, or QLC cells. Multiple data sets or data pages can be stored superimposed onto similar memory cells of a stripe, such as a quantity of data pages corresponding to the number of bits per cell are stored in a chosen stripe. In one example, in FIG. 3A, a stripe within die 300 might comprise TLC memory cells that concurrently store three data pages on one stripe. This example 3-page stripe spans across four memory holes (342-345) on a wordline layer of plane 301 and four memory holes (346-349) of plane 302 on one die, which corresponds to 24 pages of data. These 24 pages of data can be programmed with associated redundancy bits. In this manner, a die-level RAID-like behavior within a single semiconductor die can be achieved using memory cells having a selected structural arrangement.

The redundancy bits discussed herein can comprise one or more bits determined by executing a redundancy algorithm over the data bits targeted for storage. One example algorithm is an XOR algorithm, where an XOR calculation is performed over all of the data bits to be stored in the selected structural arrangement, and the output of the XOR calculation comprises the redundancy bit(s) for storage along with the data. In FIG. 3A, redundancy bit 370 can comprise an XOR calculated for data bits stored within stripe 310. In FIG. 3B, redundancy bit 390 can comprise an XOR calculated for data bits stored within stripe 380. Other example data redundancy algorithms include various checksums, parity calculations, error correction code (ECC) calculations, and the like. However, the quantity and set of bits for which the redundancy algorithm is calculated correspond to a structural arrangement of memory cells within a storage die. Also, the redundancy bits are stored within the structural arrangement with the data itself. Thus, a RAID-like behavior is achieved using low-level memory cells within a storage die.

Figure 4:
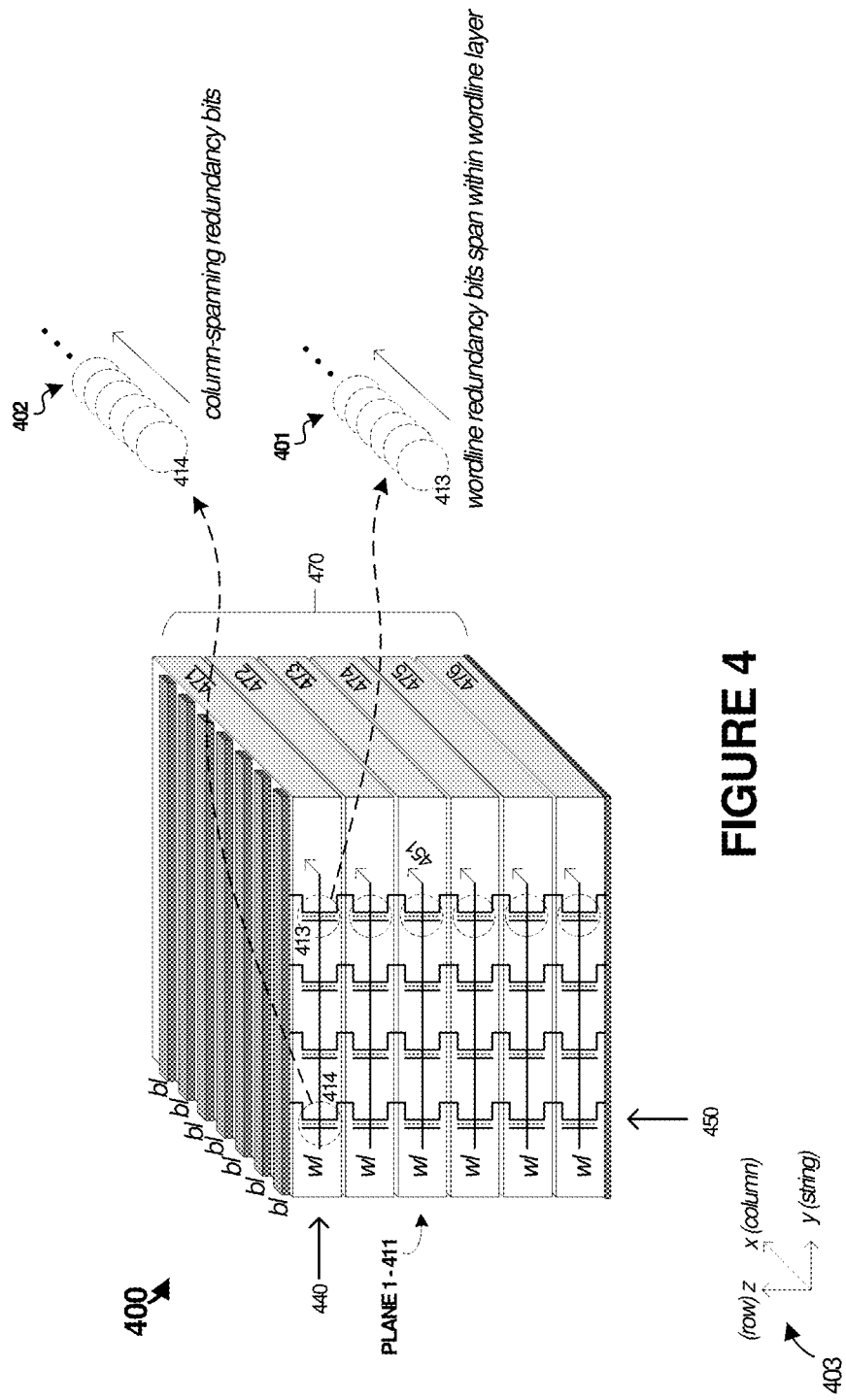
FIG. 4 illustrates an example data redundancy scheme on a data storage die in an implementation.

FIG. 4 illustrates elements of an example data storage die 400 in an implementation. FIG. 4 is provided to illustrate arrangements of 3D NAND memory cells and data stripes with redundancy bits stored therein. Coordinate system 403 is shown for referencing various directional axes in FIG. 4. In FIG. 4 a single plane 411 of memory cells is shown for clarity, and further planes might be included on data storage die 400, such as planes 301-302 seen in FIGS. 3A-3B. In plane 411, several wordline-coupled layers 470 in the z-axis are shown as layers 471-476. Plane 411 includes a collection of memory cells arranged into rows along the z-axis and columns along the y-axis. Each row of memory cells corresponds to a memory hole of memory cells sharing a bitline (bl) and each column of memory cells corresponds to a wordline of memory cells sharing a wordline (wl). Columns are formed in the 'x' axis which have different associated bitlines.

When a redundancy scheme is selected which corresponds to the structural arrangement of wordlines, then data can be spanned over a wordline in the y-axis along with other wordlines from columns into the x-axis. Configuration 401 shows redundancy bits for a particular wordline redundancy arrangement where redundancy bits 413 span columns of a 3D wordline layer in the x-axis. Thus, an x-y plane of memory cells coupled by a common wordline/wordplane stores a data page with redundancy bits for that data page stored in a set of memory cells that span the x-y plane defining each layer 471-476. When a redundancy scheme is selected which corresponds to the structural arrangement of memory holes, then data can be spanned over memory holes and columns in the y-z axes. Configuration 402 shows redundancy bits for a particular string redundancy arrangement where redundancy bits 414 span in the 'x' axis. Thus, a x-z plane of memory cells having different bitlines stores a data page with redundancy bits for that data page in a set of memory cells that span into the x-axis for associated memory holes of each column. When multi-bit memory cells are employed, then several data pages with associated redundancy bits can be concurrently stored into the memory cells of the particular structural arrangement. For example, when a TLC memory cell type is employed, then three pages with three associated sets of redundancy bits can be stored within the same memory cells comprising the x-y axis redundancy or x-z axis redundancy arrangements.

Figure 5:
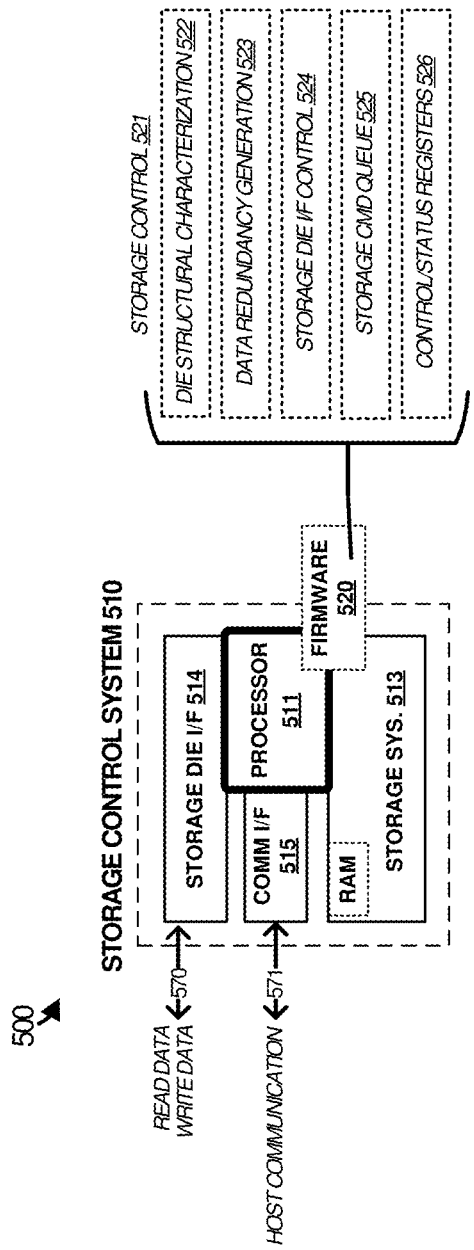
FIG. 5 illustrates a storage control system in an implementation.

FIG. 5 illustrates storage control system 510 that is representative of any system or collection of systems from which the various data storage, redundancy data calculation, data redundancy structural arrangement selection, and storage media control operations can be directed. Any of the operational architectures, platforms, scenarios, and processes disclosed herein may be implemented using elements of storage control system 510. In one implementation, storage control system 510 is representative of at least a portion of storage controller 111 of FIG. 1.

Storage control system 510 may be implemented as a single apparatus, system, or device or may be implemented in a distributed manner as multiple apparatuses, systems, or devices. Storage control system 510 includes, but is not limited to, processor 511, local storage system 513, communication interface system 515, storage die interface 515, and firmware 520. Processor 511 is operatively coupled with storage system 513 and communication interface system 515.

Processor 511 loads and executes firmware 520 from storage system 513. Firmware 520 includes storage control 521, which is representative of the processes discussed with respect to the preceding Figures. When executed by processor 511 to provide enhanced data storage, redundancy data calculation, data redundancy structural arrangement selection, and storage media control operations, firmware 520 directs processor 511 to operate as described herein for at least the various processes, operational scenarios, and sequences discussed in the foregoing implementations. Storage control system 510 may optionally include additional devices, features, or functionality not discussed for purposes of brevity.

Referring still to FIG. 5, processor 511 may comprise a microprocessor and processing circuitry that retrieves and executes firmware 520 from storage system 513. Processor 511 may be implemented within a single processing device, but may also be distributed across multiple processing devices, sub-systems, or specialized circuitry, that cooperate in executing program instructions and in performing the operations discussed herein. Examples of processor 511 include general purpose central processing units, application specific processors, and logic devices, as well as any other type of processing device, combinations, or variations thereof.

Storage system 513 may comprise any computer readable storage media readable by processor 511 and capable of storing firmware 520. Storage system 513 may include volatile and nonvolatile, removable and non-removable media implemented in any method or technology for storage of information, such as computer readable instructions, data structures, program modules, or other data. Examples of storage media include random access memory (RAM), read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 513 may also include computer readable communication media over which at least some of firmware 520 may be communicated internally or externally. Storage system 513 may be implemented as a single storage device, but may also be implemented across multiple storage devices or sub-systems co-located or distributed relative to each other. Storage system 513 may comprise additional elements, such as a controller, capable of communicating with processor 511 or possibly other systems.

Firmware 520 may be implemented in program instructions and among other functions may, when executed by processor 511, direct processor 511 to operate as described with respect to the various operational scenarios, sequences, and processes illustrated herein. For example, firmware 520 may include program instructions for providing enhanced data storage, redundancy data calculation, data redundancy structural arrangement selection, and storage media control operations, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Firmware 520 may include additional processes, programs, or components, such as operating system software or other application software, in addition to that of storage control 521. Firmware 520 may also comprise program code, scripts, macros, and other similar components. Firmware 520 may also comprise software or some other form of machine-readable processing instructions executable by processor 511.

In general, firmware 520 may, when loaded into processor 511 and executed, transform a suitable apparatus, system, or device (of which storage control system 510 is representative) overall from a general-purpose computing system into a special-purpose computing system customized to facilitate data storage, redundancy data calculation, data redundancy structural arrangement selection, and storage media control operations. Encoding firmware 520 on storage system 513 may transform the physical structure of storage system 513. The specific transformation of the physical structure may depend on various factors in different implementations of this description. Examples of such factors may include, but are not limited to, the technology used to implement the storage media of storage system 513 and whether the computer-storage media are characterized as primary or secondary storage, as well as other factors.

For example, if the computer readable storage media are implemented as semiconductor-based memory, firmware 520 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Storage control 521 can include one or more software elements, such as an operating system, devices drivers, and one or more applications. These elements can describe various portions of storage control system 510 with which storage die control elements, host interfacing elements, data redundancy elements, or other elements interact. For example, an operating system can provide a software platform on which storage control 521 is executed and allows for enhanced data storage, redundancy data calculation, data redundancy structural arrangement selection, and storage media control operations, among other operations.

In one example, die structural characterization 522 can determine various structural configurations of a target memory or storage die, such as string arrangements, bitline arrangements, wordline arrangements, 3D arrangements, layer arrangements, plane arrangements, single-or-multi level memory cell arrangements, and the like. From this information, a structural redundancy technique can be selected. Data redundancy generation 523 can use the selected structural redundancy technique to determine a data redundancy scheme that employs a structural relationship among memory cells. Data redundancy generation 523 can determine how many data redundancy bits are desired, and a configuration of those data redundancy bits. Data redundancy generation 523 can also calculate data redundancy bits when incoming write data is received by storage control system 510. Data redundancy generation 523 can perform various data checking and correction operations on read data to determine if the data read from the storage media can be corrected when errors are found or if the data has too many errors to correct. This information can be relayed to the host or to other elements within storage control system 510.

Once write data has been received with one or more write commands from a host system over link 571, then storage die interface control 524 can control operations of storage die interface system 514 to write the data to appropriate memory cells over link 570 using the selected redundancy scheme and structural arrangement of memory cells. More than one data page might be written at the same time when multi-level memory cells are employed. Storage die interface system 514 can also operate with storage die interface control 524 to perform read operations, erase operations, garbage collection operations, wear-leveling operations, and other operations with respect to the target storage media over link 570.

Storage command queue 525 can include one or more buffers or queue data structures which hold pending storage commands for completion by storage control system 510. These storage operations can include operations received over link 571 from a host system, or include operations generated internally by storage control system 510 for media maintenance, wear-leveling, or garbage collection.

Control/status registers 526 include one or more non-volatile memory elements which provide status of the operation of storage control system 510 to external elements and system over link 571. Control over the operations of control/status registers 526 can also occur via modification or alteration of values stored within control/status registers 526, or of logic-coupled ones of control/status registers 526 which tie to operation of storage control system 510. Reads/writes of ones of control/status registers 526 can occur over link 571 from one or more external systems, which may include a host device. Various example control registers might include target storage die characteristics, user-selected redundancy schemes, control registers, clock speed registers, as well as various identification information comprising serial numbers, model numbers, version numbers, and related information for both hardware and software elements. Firmware updates might also be initiated using one or more of control/status registers 526.

Storage die interface system 514 may include communication connections and elements that allow for communication link 570 to communicate with one or more storage media elements such as storage chips or storage dies. Examples of connections and elements that together allow for inter-system communication may include common Flash Memory Interface (CFI), Open NAND Flash Interface (ONFI), synchronous or asynchronous storage interface, or toggle command protocol interface, among others.

Communication interface system 515 may include communication connections and elements that allow for communication over link 571 to communicate with a host system or with other external systems (not shown in FIG. 5) over one or more communication links or networks (not shown). Examples of connections and elements that together allow for inter-system communication may include Peripheral Component Interconnect Express (PCIe), NVM Express (NVMe), Non-Volatile Memory Host Controller Interface Specification (NVMHCIS), Gen-Z, Ethernet, InfiniBand, Ethernet, Serial Attached SCSI (SAS), FibreChannel, Thunderbolt, serial AT attachment (SATA), SATA Express, universal serial bus (USB), HyperTransport (HT), Cache Coherent Interconnect for Accelerators (CCIX), or Open Coherent Accelerator Processor Interface (OpenCAPI) links. Other example links which might be used separately or in combination with the above include discrete control links, system management buses, serial control interfaces, register programming interfaces, network interface cards, antennas, power amplifiers, RF circuitry, transceivers, and other communication circuitry. The connections and devices may communicate over communication media to exchange packetized communications with other computing systems or networks of systems, such as metal, glass, air, or any other suitable communication media. Communication interface system 515 may include user interface elements, such as programming registers, control/status registers 526, APIs, or other user-facing control and status elements.

Certain inventive aspects may be appreciated from the foregoing disclosure, of which the following are various examples.

Example 1

A method of operating a data storage system, comprising identifying data for storage in a non-volatile memory die, generating one or more data redundancy bits for the data, and writing one or more data pages to the non-volatile memory die by at least spanning bits of the data and the one or more data redundancy bits across a quantity of data storage cells that share a structural property in the non-volatile memory die.

Example 2

The method of Example 1, where the one or more data redundancy bits comprise one or more XOR bits calculated from the bits of the data, and where the one or more XOR bits are written after storage of the bits of the data.

Example 3

The method of Examples 1-2, where the structural property comprises a wordline arrangement that comprises the quantity of data storage cells formed in the non-volatile memory die.

Example 4

The method of Examples 1-3, where the structural property comprises an arrangement corresponding to memory holes having separate bitlines that comprise the quantity of data storage cells formed in the non-volatile memory die.

Example 5

The method of Examples 1-4, further comprising writing the one or more data pages to the non-volatile memory die by at least spanning the bits of the data over more than one plane of the non-volatile memory die and storing the one or more data redundancy bits in memory cells on a single plane of the non-volatile memory die.

Example 6

The method of Examples 1-5, where the non-volatile memory die comprises a 3D NAND flash memory die, and where the quantity of data storage cells that share the structural property comprise multi-level cells of the 3D NAND flash memory die each within a plurality of worldline planes of memory cells, and comprising writing the one or more data pages to the non-volatile memory die by at least first writing the bits of the data as first multi-level representations into first memory cells among a corresponding one of the plurality of worldline planes, and subsequently writing the one or more data redundancy bits as second multi-level representations into second memory cells among the corresponding one of the plurality of worldline planes.

Example 7

The method of Examples 1-6, where the non-volatile memory die comprises a 3D NAND flash memory die, and where the quantity of data storage cells that share the structural property comprise multi-level cells of the 3D NAND flash memory die within memory holes spanning across one or more columns of the 3D NAND flash memory die, and comprising writing the one or more data pages to the non-volatile memory die by at least sequentially writing the bits of the data as first multi-level representations into first memory cells among memory holes corresponding to the one or more columns, and subsequently writing the one or more data redundancy bits as second multi-level representations into second memory cells among the memory holes.

Example 8

A storage control system, comprising a data interface configured to receive data for storage in a non-volatile memory die, a control circuit configured to generate one or more data redundancy bits for the data, and a memory interface configured to write the data to the non-volatile memory die by at least spanning one or more data pages comprising bits of the data and the one or more data redundancy bits across a quantity of data storage cells that share a structural property in the non-volatile memory die.

Example 9

The storage control system of Example 8, where the one or more data redundancy bits comprise one or more XOR bits calculated from the bits of the data, and where the one or more XOR bits are written after storage of the bits of the data.

Example 10

The storage control system of Examples 8-9, where the structural property comprises a wordline arrangement that comprises the quantity of data storage cells formed in the non-volatile memory die.

Example 11

The storage control system of Examples 8-10, where the structural property comprises an arrangement corresponding to memory holes having separate bitlines that comprise the quantity of data storage cells formed in the non-volatile memory die.

Example 12

The storage control system of Examples 8-11, comprising the memory interface further configured to write the one or more data pages to the non-volatile memory die by at least spanning the bits of the data over more than one plane of the non-volatile memory die and storing the one or more data redundancy bits in memory cells on a single plane of the non-volatile memory die.

Example 13

The storage control system of Examples 8-12, where the non-volatile memory die comprises a 3D NAND flash memory die, and where the quantity of data storage cells that share the structural property comprise multi-level cells of the 3D NAND flash memory die each within a plurality of worldline planes of memory cells, and comprising writing the one or more data pages to the non-volatile memory die by at least first writing the bits of the data as first multi-level representations into first memory cells among a corresponding one of the plurality of worldline planes, and subsequently writing the one or more data redundancy bits as second multi-level representations into second memory cells among the corresponding one of the plurality of worldline planes.

Example 14

The storage control system of Examples 8-13, where the non-volatile memory die comprises a 3D NAND flash memory die, and where the quantity of data storage cells that share the structural property comprise multi-level cells of the 3D NAND flash memory die within memory holes spanning across one or more columns of the 3D NAND flash memory die, and comprising writing the one or more data pages to the non-volatile memory die by at least sequentially writing the bits of the data as first multi-level representations into first memory cells among memory holes corresponding to the one or more columns, and subsequently writing the one or more data redundancy bits as second multi-level representations into second memory cells among the memory holes.

Example 15

An apparatus, comprising one or more computer readable storage media, a processing system operatively coupled with the one or more computer readable storage media, and program instructions stored on the one or more computer readable storage media. Based on being read and executed by the processing system, the program instructions direct the processing system to at least identify data for storage in a non-volatile memory die, generate one or more data redundancy bits for the data, and write one or more data pages to the non-volatile memory die by at least spanning bits of the data and the one or more data redundancy bits across a quantity of data storage cells that share a structural property in the non-volatile memory die.

Example 16

The apparatus of Example 15, where the one or more data redundancy bits comprise one or more XOR bits calculated from the bits of the data, and where the one or more XOR bits are written after storage of the bits of the data.

Example 17

The method of Examples 15-16, where the structural property comprises a selected one among a wordline spanning arrangement and a bitline spanning arrangement that comprises the quantity of data storage cells formed in the non-volatile memory die.

Example 18

The apparatus of Examples 15-17, comprising further program instructions, based on being executed by the processing system, direct the processing system to at least write the one or more data pages to the non-volatile memory die by at least spanning the bits of the data over more than one plane of the non-volatile memory die and storing the one or more data redundancy bits in memory cells on a single plane of the non-volatile memory die.

Example 19

The method of Examples 15-18, where the non-volatile memory die comprises a 3D NAND flash memory die, and where the quantity of data storage cells that share the structural property comprise multi-level cells of the 3D NAND flash memory die each within a plurality of worldline planes of memory cells, and comprising further program instructions, based on being executed by the processing system, direct the processing system to at least write the one or more data pages to the non-volatile memory die by at least first writing the bits of the data as first multi-level representations into first memory cells among a corresponding one of the plurality of worldline planes, and subsequently writing the one or more data redundancy bits as second multi-level representations into second memory cells among the corresponding one of the plurality of worldline planes.

Example 20

The method of Examples 15-19, where the non-volatile memory die comprises a 3D NAND flash memory die, and where the quantity of data storage cells that share the structural property comprise multi-level cells of the 3D NAND flash memory die within memory holes spanning across one or more columns of the 3D NAND flash memory die, and comprising further program instructions, based on being executed by the processing system, direct the processing system to at least write the one or more data pages to the non-volatile memory die by at least sequentially writing the bits of the data as first multi-level representations into first memory cells among memory holes corresponding to the one or more columns, and subsequently writing the one or more data redundancy bits as second multi-level representations into second memory cells among the memory holes.

The functional block diagrams, operational scenarios and sequences, and flow diagrams provided in the Figures are representative of exemplary systems, environments, and methodologies for performing novel aspects of the disclosure. The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method of operating a data storage system, comprising:
    identifying data for storage in a non-volatile memory die;
    generating one or more data redundancy bits for the data; and
    writing one or more data pages to the non-volatile memory die by at least spanning bits of the data and the one or more data redundancy bits across a quantity of data storage cells of more than one plane of the non-volatile memory die, wherein planes of the non-volatile memory die comprise groupings of blocks of data storage cells, with each of the planes having independently controlled source lines and bit lines that provide for at least concurrent write operations to each of the planes.

2. The method of claim 1, wherein the one or more data redundancy bits comprise one or more XOR bits calculated from the bits of the data, and wherein the one or more XOR bits are written after storage of the bits of the data.

3. The method of claim 1, further comprising:
    writing the one or more data pages to the non-volatile memory die by at least spanning the bits of the data over the more than one plane of the non-volatile memory die and storing the one or more data redundancy bits in memory cells on a single plane of the non-volatile memory die.

4. The method of claim 1, wherein the non-volatile memory die comprises a 3D NAND flash memory die, and wherein the quantity of data storage cells comprise multi-level cells of the 3D NAND flash memory die, and comprising:
    writing the one or more data pages to the non-volatile memory die by at least first writing the bits of the data as first multi-level representations into first memory cells, and subsequently writing the one or more data redundancy bits as second multi-level representations into second memory cells.

5. A storage control system, comprising:
a data interface configured to receive data for storage in a non-volatile memory die;
a control circuit configured to generate one or more data redundancy bits for the data; and
a memory interface configured to write the data to the non-volatile memory die by at least spanning one or more data pages comprising bits of the data and the one or more data redundancy bits across a quantity of data storage cells of more than one plane of the non-volatile memory die, wherein planes of the non-volatile memory die comprise groupings of blocks of data storage cells, with each of the planes having independently controlled source lines and bit lines that provide for at least concurrent write operations to each of the planes.

6. The storage control system of claim 5, wherein the one or more data redundancy bits comprise one or more XOR bits calculated from the bits of the data, and wherein the one or more XOR bits are written after storage of the bits of the data.

7. The storage control system of claim 5, comprising:
the memory interface further configured to write the one or more data pages to the non-volatile memory die by at least spanning the bits of the data over the more than one plane of the non-volatile memory die and storing the one or more data redundancy bits in memory cells on a single plane of the non-volatile memory die.

8. The storage control system of claim 5, wherein the non-volatile memory die comprises a 3D NAND flash memory die, and wherein the quantity of data storage cells comprise multi-level cells of the 3D NAND flash memory die, and comprising:
writing the one or more data pages to the non-volatile memory die by at least first writing the bits of the data as first multi-level representations into first memory cells, and subsequently writing the one or more data redundancy bits as second multi-level representations into second memory cells.

9. An apparatus, comprising:
one or more computer readable storage media;
program instructions stored on the one or more computer readable storage media that, based on being read and executed by a processing system, direct the processing system to at least:
identify data for storage in a non-volatile memory die;
generate one or more data redundancy bits for the data; and
write one or more data pages to the non-volatile memory die by at least spanning bits of the data and the one or more data redundancy bits across a quantity of data storage cells of more than one plane of the non-volatile memory die, wherein planes of the non-volatile memory die comprise groupings of blocks of data storage cells, with each of the planes having independently controlled source lines and bit lines that provide for at least concurrent write operations to each of the planes.

10. The apparatus of claim 9, wherein the one or more data redundancy bits comprise one or more XOR bits calculated from the bits of the data, and wherein the one or more XOR bits are written after storage of the bits of the data.

11. The apparatus of claim 9, comprising further program instructions, based on being executed by the processing system, direct the processing system to at least:
write the one or more data pages to the non-volatile memory die by at least spanning the bits of the data the over more than one plane of the non-volatile memory die and storing the one or more data redundancy bits in memory cells on a single plane of the non-volatile memory die.

12. The apparatus of claim 9, wherein the non-volatile memory die comprises a 3D NAND flash memory die, and wherein the quantity of data storage cells comprise multi-level cells of the 3D NAND flash memory die, and comprising further program instructions, based on being executed by the processing system, direct the processing system to at least:
write the one or more data pages to the non-volatile memory die by at least first writing the bits of the data as first multi-level representations into first memory cells, and subsequently writing the one or more data redundancy bits as second multi-level representations into second memory cells.

* * * * *